United States Patent [19]

Kusazaki

[11] Patent Number: 4,549,131
[45] Date of Patent: Oct. 22, 1985

[54] SEMICONDUCTOR DEVICE AND TECHNIQUE WHICH EMPLOYS NORMALLY UNUSED INTERCONNECTION ELEMENTS AS RESISTOR CIRCUIT ELEMENTS

[75] Inventor: Yoshimasa Kusazaki, Hachioji, Japan

[73] Assignee: Olympus Optical Company Limited, Tokyo, Japan

[21] Appl. No.: 451,834

[22] Filed: Dec. 21, 1982

[30] Foreign Application Priority Data

Dec. 26, 1981 [JP] Japan .................................. 56-210607

[51] Int. Cl.⁴ ...................... H01L 27/00; H01L 23/50
[52] U.S. Cl. ...................................... 323/354; 357/45; 357/51
[58] Field of Search .................. 323/353, 354; 357/45, 357/51

[56] References Cited

U.S. PATENT DOCUMENTS

| | | | |
|---|---|---|---|
| 3,312,871 | 4/1967 | Seki et al. | 357/51 |
| 4,238,724 | 12/1980 | Klaus et al. | 323/354 |
| 4,412,237 | 10/1983 | Matsumura et al. | 357/45 |

OTHER PUBLICATIONS

Ottensen, "Inverting Function Generation," IBM Tech. Discl. Bul., vol. 13, No. 11, pp. 3549–3550, Apr. 1971.
Bross et al., "Modular Resistor Array," IBM Tech. Discl. Bul., vol. 13, No. 5, p. 1105, Oct. 1970.
Freed et al., "Integrated Circuit Master Slice with a Multitude of Epitaxial Pockets," IBM Tech. Discl. Bul., vol. 15, No. 6, pp. 1753, 1754, Nov. 1972.

*Primary Examiner*—William H. Beha, Jr.
*Attorney, Agent, or Firm*—Parkhurst & Oliff

[57] ABSTRACT

A semiconductor device for use in an optical device and a method of manufacturing the same are disclosed. The device comprises a plurality of active cells and a plurality of wiring cells. The resistors formed in the device are constituted by combining these wiring cells.

15 Claims, 7 Drawing Figures

SEMICONDUCTOR DEVICE AND TECHNIQUE WHICH EMPLOYS NORMALLY UNUSED INTERCONNECTION ELEMENTS AS RESISTOR CIRCUIT ELEMENTS

BACKGROUND OF THE INVENTION

The present invention relates to a semiconductor device and more particularly an integrated semiconductor device with resistor elements formed by a gate array system.

Nowadays, the semiconductor integrated circuit has been well developed and various kinds of semiconductor devices having very complicated function are manufactured economically in a mass production scale by using finely formed mask patterns. Contrary to this, when semiconductor devices for special use are manufactured in a small scale, use is generally made of a manufacturing technique such as a master slice approach and a gate array system, because mask patterns cannot be formed economically.

In the gate array system, at first basic integrated circuits are formed. The basic integrated circuit includes number of function cells including active elements such as bipolar transistors and MOS transistors and wiring cells called a cross-under, the active cells and wiring cells being arranged regularly. Then these active cells and wiring cells are selectively connected by a wiring process to form a desired logic circuit. In this manner, a given semiconductor device is obtained.

FIG. 1 is a schematic view showing an example of an arrangement of active cells and wiring cells of such a semiconductor device formed by the gate array system. The device comprises active cell regions 1a to 1d each including bipolar transistors and MOS transistors and wiring cell regions 2a to 2d. The active cell regions are connected by means of the wiring cell regions. As illustrated in FIG. 1, the active cell regions 1a to 1d and wiring cell regions 2a to 2d are arranged alternately in a regular manner.

FIG. 2 is a plan view showing part of the active cell regions and wiring cell regions in an enlarged scale. In the active cell region 1a there are formed active cells 11 to 14 and in the active cell region 1c there are formed active cells 15 to 18. In FIG. 2, the active cells 11, 12 15 and 16 are P channel MOS transistors and active cells 13, 14, 17 and 18 and N channel MOS transistors. Each active cell is composed of a series circuit of two MOS transistors. The active cells may be constructed in different ways. For instance, each cell may be formed by one or more than two transistors or may be composed of one or more bipolar transistors.

In the wiring cell region 2a there are formed a plurality of wiring cells 21 to 26 arranged in parallel with each other. Each of the wiring cells 21 to 26 has a strip-shaped P type impurity diffusion layer called a cross-under serving as a conductor connecting active cells to each other. Surfaces of the active cell regions 1a to 1d and wiring cell regions 2a to 2d are covered with an insulating layer 30 consisting of $SiO_2$. In the $SiO_2$ layer 30, openings are formed at positions corresponding to given electrode portions of the active cells and wiring cells by means of a known photo-etching process. Then, aluminum electrode contacts 31 to 34 are formed via the openings, on the electrode portions.

Then aluminum conductors 41 to 44 are deposited on the insulating layer 30, while portions of the conductors are selectively connected to the electrode contacts to form a required logic circuit.

As can be read from FIG. 2, the wiring cells of the gate array system have a function to avoid possible short circuits of the deposited conductors on the insulating layer 30 and to make simple the wiring operation. For instance, when the electrode contacts 31 and 33 are connected by means of the conductor 41 and the electrode contacts 32 and 34 are connected by the conductor 42, it is possible to couple the electrode contact 33 of the active cell 11 and the electrode 34 of the active cell 17 with each other by means of the wiring cell 22 in the wiring cell region 2a without being short-circuited with the wiring conductors 43 and 44 on the insulating layer 30. In this manner, in the gate array system, the wiring cells are exclusively used as the connecting wires for connecting the active cells. However, in practice all the wiring cells are not used for the connection and the wiring cells 21, 23 and 24 are not used in the finally obtained semiconductor integrated circuit.

In the known semiconductor device of the gate array system, when it is required to include resistance elements such as potentiometers, necessary resistors are connected externally, because in the basic semiconductor device there is not formed any resistance elements. Therefore, the manufacturing steps are increased and thus, the reliability of the device becomes low and the size of the device becomes large.

SUMMARY OF THE INVENTION

The present invention has for its object to provide a semiconductor device in which resistance elements can be formed integrally therewith by utilizing unemployed wiring cells.

It is another object of the invention to provide a semiconductor device which can be made simple in construction, small in size and can have a high reliability.

According to the invention, a semiconductor device comprising a semiconductor body having a given conductivity type, a plurality of active cells formed in the body, a plurality of wiring cells formed in the body, means for connecting the active cells each other through the wiring cells, a plurality of resistor elements formed by combining unemployed wiring cells each having a specific resistivity, and means for connecting the resistor elements to the active cells.

The present invention also relates to a method of manufacturing a semicondcutor device and has for its object to provide a novel and useful method for manufacturing simply a semiconductor device of the gate array system, in which resistance elements such as potentiometers can be integrally formed.

According to the invention, a method of manufacturing a semiconductor device comprising steps of providing a semiconductor body having given conductivity type, forming a plurality of active cells in the semiconductor body, forming a plurality of wiring cells in the semiconductor body, connecting the active cells each other through the wiring cells, forming a plurality of resistor elements by combining the wiring cells, and connecting the resistor elements to the active cells.

DESCRIPTION OF THE PREFERRED EMBODIMENT

Figure 2:
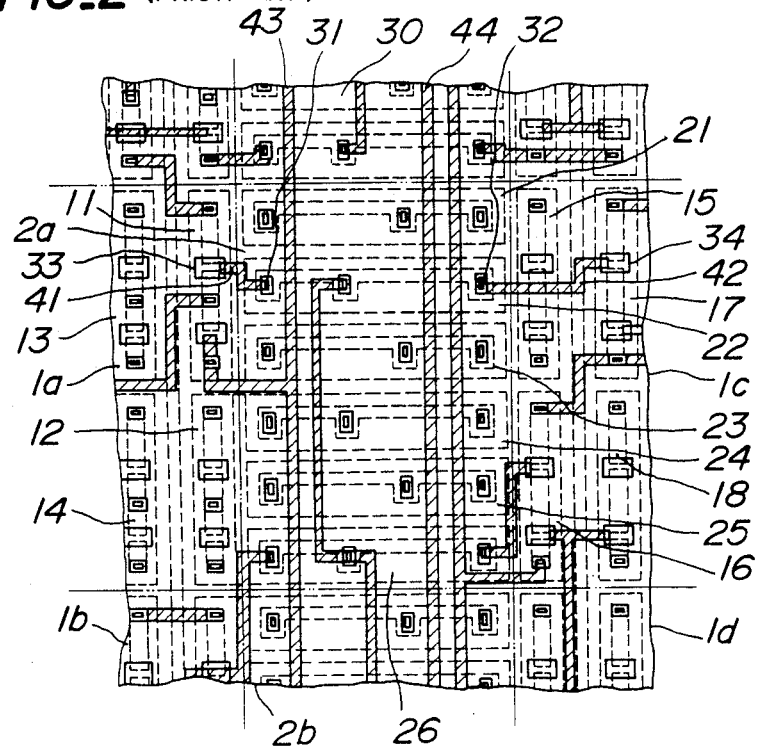
FIG. 2 is a partial plan view illustrating a conventional semiconductor device having an arrangement of active cells and wiring cells shown in FIG. 1.
Figure 3:
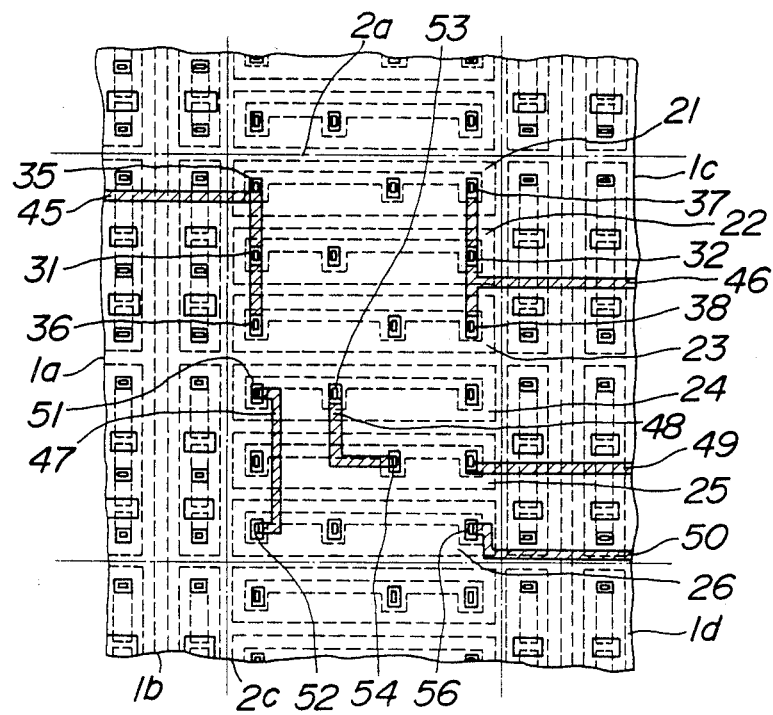
FIG. 3 is a partial plan view showing one embodiment of resistor elements formed in a semiconductor device according to the invention and manufactured by a method of forming a semiconductor device according to the invention.

Referring now to FIG. 3 there is shown one embodiment of a semiconductor device structure according to the invention and a method of manufacturing the same. In FIG. 3, for the sake of simplicity, only the construction of resistance element is shown and same reference numerals as shown in FIG. 2 designate like or functionally equivalent parts.

In a wiring region 2a of a semiconductor body, electrodes 35, 31 and 36 formed on one end portion of respective wiring cells 21, 22 and 23 are connected through a wiring conductor 45 and electrodes 37, 32 and 38 formed on another end portion of respective wiring cells 21, 22 and 23 are connected through a wiring conductor 46.

Figure 4:
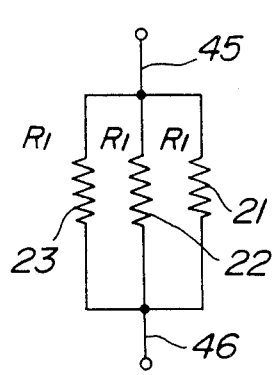
FIGS. 4 and 5 are equivalent circuits of resistor elements constructed by wiring cells.

Wiring cells 21, 22 and 23 are formed by a P type impurity diffusion layer and have a certain resistance value (commonly, few hundreds of ohm to 1000 ohm) although the cell is used as a wiring conductor. For respective wiring cells 21, 22 and 23, provided that resistance value between both end electrodes thereof is $R_1$, an equivalent circuit obtained by wiring cells 21, 22 and 23 which are connected through wiring conductors 45 and 46, becomes a parallel combination and resistors having resistance value $R_1$ as shown in FIG. 4 thereby obtaining a resistor element having a combined resistance value $R_1/3$. In this case the combined resistance value obtained by a parallel combination of wiring cells becomes smaller than the resistance value $R_1$ between both end electrodes of one wiring cell but in the present invention the wiring cell having whole resistance value obtained by properly combining the wiring cells is referred to as a resistor element.

Figure 5:
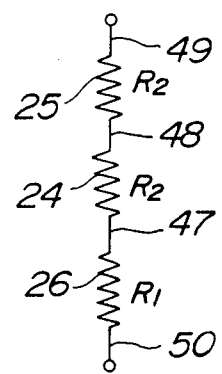

In the wiring cell region 2a shown in FIG. 3, electrodes 51 and 52 formed on one end portion of wiring cell 24 and 26 are connected through a wiring conductor 47, electrodes 53 and 54 formed on the central portion of wiring cell 24 and 25 are connected through a wiring conductor 48, and electrodes 55 and 56 formed on another end portion of wiring cell 25 and 26 are connected through wiring conductors 49 and 50, respectively. An equivalent circuit obtained by such a construction becomes a series combination of resistors as shown in FIG. 5 thereby obtaining a resistor element having a combined resistance value $(R_1+2R_2)$, provided that resistance values between electrodes 51 and 53 of the wiring cell 24 and between electrodes 54 and 55 of the wiring cell 25 in $R_2$, respectively. If the parallel combination and the series combination of resistors shown in FIGS. 4 and 5 are appropriately combined a resistor element having resistance value of a wide range can be formed.

In the semicondcutor device formed by the gate array system a plurality of the same wiring cells are arranged in regular order so that the amount of scatter in resistance value of the wiring cell is small and thus the resistor element obtained by the manufacturing method according to the invention is suitable to form a voltage dividing resistor circuit or the like having resistance value in the form of, for example, substantially arithmetic series and substantially geometric series.

Figure 1:
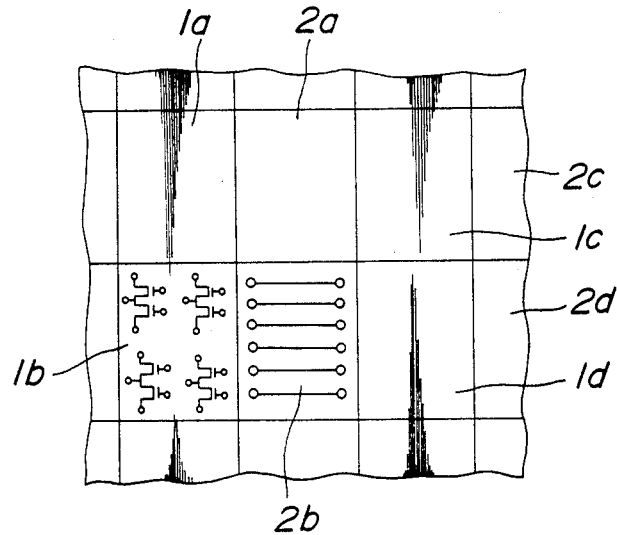
FIG. 1 is a diagrammatic view showing an arrangement of active cells and wiring cells of a semiconductor device formed by gate array system and equivalent circuits thereof.

Although the wiring construction shown in FIG. 3 is explained with the use of the wiring construction shown in FIG. 1 for convenience, a respective wiring cell constituting a resistor element is assumed to be a utilization of residual wiring cells which are not used as a connection of an active cell.

In the semiconductor device according to the present invention, unused wiring cells are appropriately combined to form resistor elements which are accommodated in the semiconductor device so that it is possible to improve or increase utilization efficiency of the cell in the basic integrated circuit structure and thus the semiconductor device can be made small in construction and light in weight as compared with conventional semiconductor device having external resistor element.

In the method of manufacturing semiconductor device according to the invention, it is possible to form desired resistor elements simultaneously during manufacture of semiconductor device so that manufacturing steps become simple as compared with conventional manufacturing steps and thus high reliable semiconductor device can be obtained.

The above embodiment, moreover, describes a C-MOS structure of gate array system, but the invention may be applied to a bipolar transistor structure of gate array system.

Figure 6:
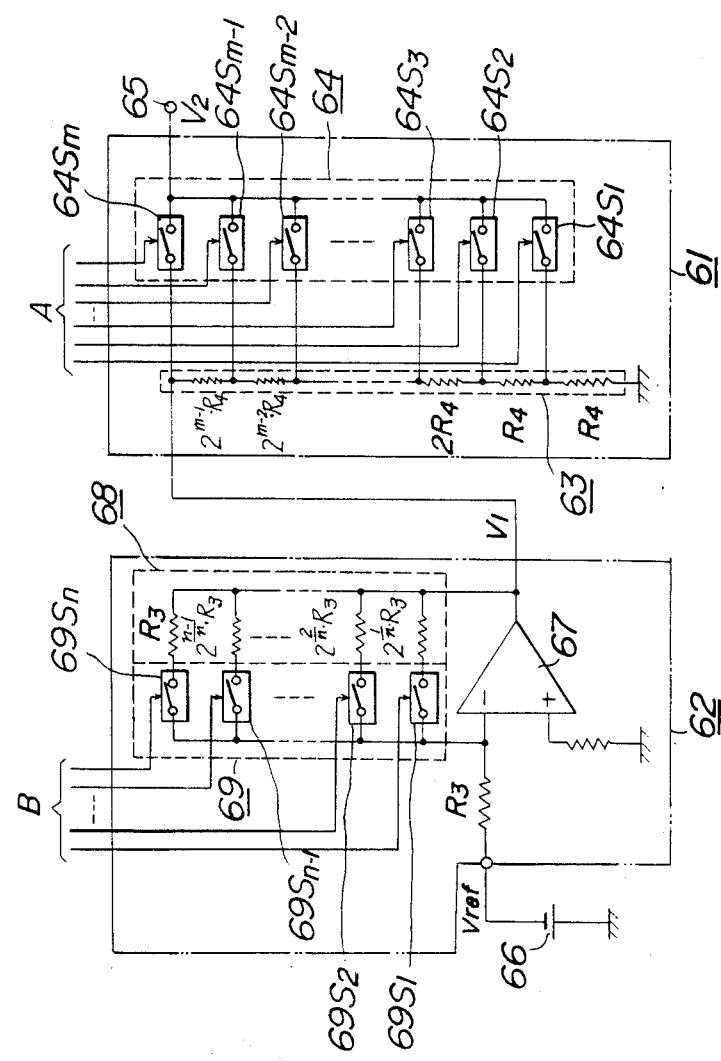
FIGS. 6 and 7 are wiring diagrams showing the semiconductor device including resistor elements formed by the method according to the invention.
Figure 7:
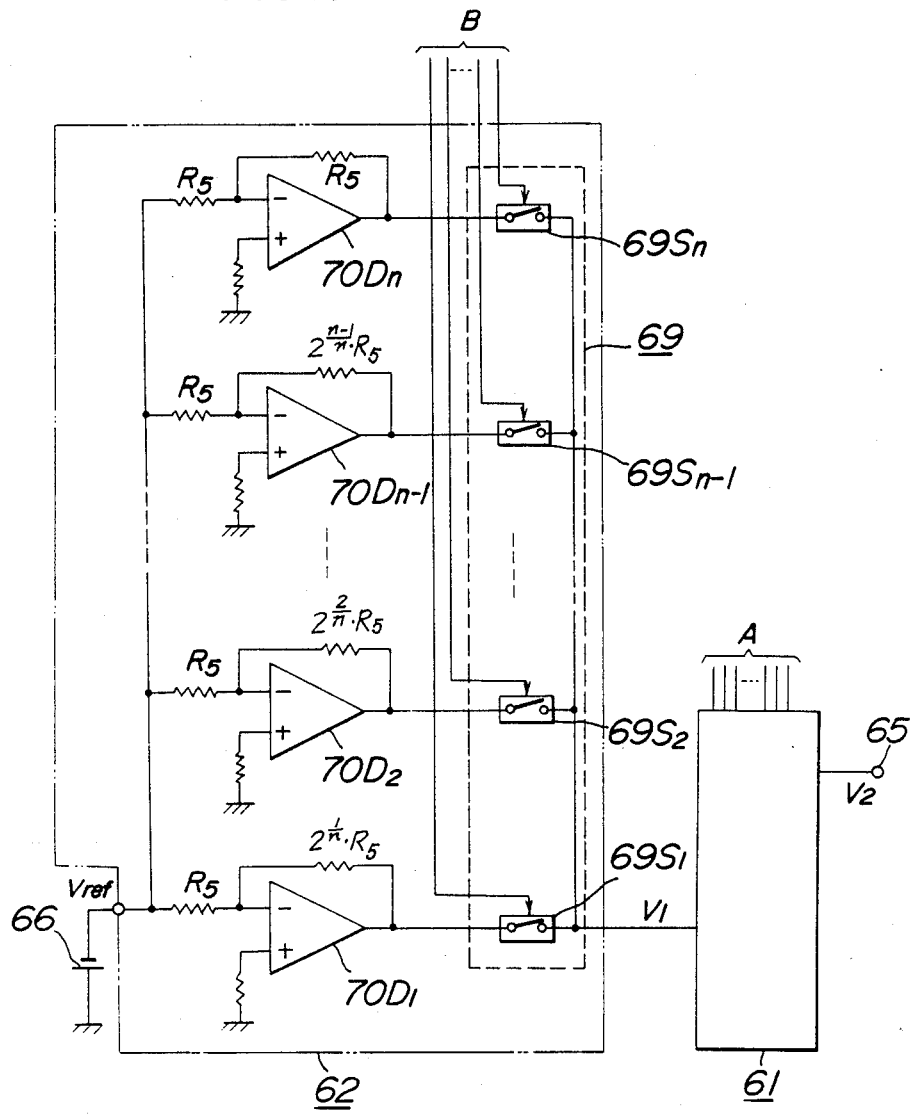

FIGS. 6 and 7 show an embodiment of circuit structure suitable for construction using semiconductor device which is integrally constructed and includes resistor elements according to the invention, such as a variable reference voltage generator circuit which is used in a camera or the like.

The variable reference voltage generator circuit shown in FIG. 6 comprises a 1/2 geometric voltage dividing circuit 61 and a $2^{1/n}$ geometric voltage generating circuit 62. The ½ geometric voltage dividing circuit 61 receives output voltage $V_1$ of the $2^{1/n}$ geometric voltage generating circuit 62 connected thereto in series as an input voltage and is so constructed that in order to generate output voltage in the form of substantially geometric series having 1/2 common ratio by using the voltage $V_1$ as a reference voltage, the input voltage as the reference voltage $V_1$ is divided by a group 63 of series connected voltage dividing resistors having resistance values $R_4$, $R_4$ $2R_4$,---$2^{m-1}R_4$ (m is positive integer) in the form of substantially geometric series with common ratio of 1/2, and respective semiconductor switches $64S_1$, $64S_2$,---$64S_m$ constituting first switch means 64. Therefore, voltages in the form of substantially geometric series having a common ratio of 1/2, that is, a plurality of reference voltages $V_2$ having 1 EV step can be generated by selecting respective semiconductor switches $64S_1$, $64S_2$,---$64S_m$ with a group of control lines A.

The $2^{1/n}$ geometric voltage generating circuit 62 comprises a coefficient multiplier constituted by an operational amplifier 67 receiving reference voltage $V_{ref}$ of a reference voltage source 66 as an input voltage, a group 68 of feed back resistors having resistance value in the form of substantially geometric progression with common ratio of $2^{1/n}$ and consisting of respective resistance values $2^{1/n}R_3$, $2^{2/n}R_3$,---$2^{n-1/n}R_3$, $R_3$ which determine coefficient when assuming input resistance value of the multiplier as $R_3$, and second switch means 69 consisting of semiconductor switches $69S_1$, $69S_2$,---$69S_n$ for selectively inserting respective resistors in the feed back path of the operational amplifier 67.

The signal having 1/n EV step can generate $2^{1/n}$ geometric voltage, that is, reference voltage $V_1$ changing with 1/n EV step in connection with input voltage of the operational amplifier 67, that is, voltage $V_{ref}$ as output voltage $V_1$ of the operational amplifier 67, by selecting particular one of resistors $2^{1/n}R_3$, $2^{2/n}R_3$,---$2^{n-1/n}R_3$, $R_3$ inserted in the feed back path of the operational amplifier 67 with particular one of semiconductor switches $69S_1$, $69S_2$---$69S_n$ in semiconductor switch means 69 controlled by control signals from a group of control lines B.

In this circuitry, the embodiment of the $2^{1/n}$ geometric voltage generating circuit 62 and 1/2 geometric voltage dividing circuit 61 are connected in series so as to supply reference voltage $V_1$ from the $2^{1/n}$ geometric voltage generating circuit 62 for generating 1/n EV step voltage, that is, geometric voltage having common ratio of 1/2 as input voltage of 1/2 geometric voltage dividing circuit 61 for generating 1 EV step voltage, that is, geometric voltage having common ratio of 1/2 of next stage, so that the reference voltage $V_2$ having a plurality of steps at intervals of 1/n EV step and 1 EV step and suitable for automatic exposure of camera or the like can be generated from the output terminal 65 by controlling the first and second switch means 64 and 69 with control signals supplied from the groups of control lines A and B.

In the case of manufacturing a part or the whole of such a sort of simple analog-to-digital converter circuit by adopting the master slice approach, the series connected voltage dividing resistor group 63 can be constructed by using the resistor element which is formed by appropriately combining wiring cells by the above described method according to the invention. The feed back resistor group 68 can also be manufactured together with the input resistor $R_3$ by the method according to the invention when permitting a certain error.

FIG. 7 shows an alternative embodiment of the circuit construction shown in FIG. 6. This embodiment is similar to that shown in FIG. 6, except for the construction of $2^{1/n}$ geometric voltage generating circuit 62, so that like reference numerals designate like or functionally equivalent parts.

In FIG. 7 the $2^{1/n}$ geometric voltage generating circuit 62 comprises a plurality of coefficient multipliers formed by a plurality of operational amplifiers 70D, $70D_2$,---$70D_n$, and second switch means 69 having a plurality of semiconductor switches $69S_1$, $69S_2$,---$69S_n$ for selectively supplying outputs of coefficient multipliers to next 1/2 geometric voltage dividing circuit 61 by the above semiconductor switches operated by control signals from the control line group B.

Respective feed back resistors for determining amplification of respective operational amplifiers $70D_1$, $70D_2$,---$70D_n$ constituting coefficient multiplier are set as $2^{1/n}R_5$, $2^{2/n}R_5$,---$2^{n-1/n}R_5$, $R_5$ when assuming respective input resistance values as $R_5$ so as to generate output voltage in the from of substantially geometric progression having common ratio of $2^{1/n}$ is connected with input voltage $V_{ref}$ from the reference voltage source 66 by the coefficient multiplier formed by respective operational amplifiers.

In this way, respective output voltages in the form of substantially geometric progression having common ratio of $2^{1/n}$ are generated by coefficient multipliers formed by respective operational amplifiers $70D_1$, $70D_2$,---$70D_n$ so that a plurality of reference voltages $V_1$ in the form of substantially geometric series having common ratio of $2^{1/n}$, that is, 1/n EV signals can be generated as output of $2^{1/n}$ geometric voltage generating circuit 62 by selectively operating predetermined semiconductor switch of the second switch means 69 by control signals from the control line group B.

In the case of manufacturing semiconductor devices by the master slice, approach respective resistors in the $2^{1/n}$ geometric voltage generating circuit 62 can easily be accommodated in the semiconductor device by the method according to the present invention.

In the circuit construction shown in FIGS. 6 and 7 the 1/2 geometric voltage dividing circuit 61 and the $2^{1/n}$ geometric voltage generating circuit 62 may be changed in their order of connection to one another.

As seen from the above explanation, according to the invention when manufacturing semiconductor device by adopting master slice approach residual wiring cells which are not utilized to construct logic circuit are appropriately combined to form resistor element having desired resistance value so that an effective utilization efficiency of basic integrated circuit structure is increased, resistor element having desired resistance value can be accommodated in the semiconductor device and thus the step of providing external resistor element can be omitted resulting in simplification of manufacturing steps and provision of high reliable and miniaturized semiconductor device.

What is claimed is:

1. In a semiconductor device having a semiconductor body with a given conductivity type, a plurality of active cells formed in the body to define circuit elements, a plurality of wiring cells formed in the body, and means for interconnecting selected ones of the active cells to one another through selected ones of the wiring cells to define a circuit configuration, the improvement comprising:

a plurality of resistor elements, each resistor element being constructed by electrically interconnecting at least a portion of at least one of the non-selected wiring cells with at least a portion of at least another one of said non-selected wiring cells to form a resistor element separate from the selected ones of said wiring cells, each of said wiring cells having a specific resistivity; and means for interconnecting said plurality of resistor elements to said active cells as separate resistive circuit elements of said circuit configuration.

2. The semiconductor device of claim 1 wherein at least one resistor element is constructed as the interconnection of at least two non-selected wiring cells in electrical parallel.

3. The semiconductor device of claim 1 wherein at least one resistor element is constructed as the connection of two non-selected wiring cells in electrical series.

4. The semiconductor device of claim 1 wherein at least one resistor element is constructed by the interconnection of a plurality of wiring cells interconnected to form resistors defining a potentiometer as a circuit element.

5. The semiconductor device of claim 4 wherein the resistances of the resistors defining the potentiometer are selected to substantially define a geometric series of resistance values.

6. The semiconductor device of claim 1 wherein said selected ones of said active cells connected through said selected ones of said wiring cells are connected to define at least one amplifier and a plurality of switches as part of said circuit configuration, said plurality of resistor elements are connected to define feedback resistors as circuit elements, and said switches are coupled to respective ones of said plurality of feedback resistors and to said at least one amplifier to define a plurality of switch circuits which can selectively couple each of said feedback resistors to form a feedback path for the said at least one amplifier.

7. The semiconductor device of claim 6 wherein the resistances of said feedback resistors are selected to define substantially a geometric series of resistance values.

8. The semiconductor device of claim 1 wherein said selected ones of said active cells connected through said selected ones of said wiring cells are connected to define at least a plurality of amplifiers and a plurality of switches as part of said circuit configuration, said plurality of resistor elements are connected to define a plurality of feedback resistors as circuit elements, and said switches are coupled to respective ones of said plurality of feedback resistors and said plurality of amplifiers to define a plurality of switch circuits which can each selectively couple one of said feedback resistors to form a feedback path for one of said plurality of amplifiers.

9. The semiconductor device of claim 8 wherein the resistances of the feedback resistors are selected to substantially define a geometric series of resistance values.

10. The semiconductor device of claim 1 wherein at least some of said plurality of active cells include MOS transistors.

11. The semiconductor device of claim 1 wherein at least some said active cells contain bipolar transistors.

12. The semiconductor device of claim 1 wherein said plurality of active calls and said plurality of wiring cells are constructed to define a gate array system.

13. In a method of manufacturing a semiconductor device having the steps of providing a semiconductor body having a given conductivity type, forming a plurality of active cells in the semiconductor body to define circuit elements, forming a plurality of wiring cells in the semiconductor body, and connecting selected one of the active cells to one another through selected ones of the wiring cells to define a circuit configuration, the improvement comprising:

forming a plurality of resistor elements such that each resistor element is constructed by electrically interconnecting at least a portion of at least one of the non-selected wiring cells with at least a portion of at least another one of said non-selected wiring cells to form a resistor element separate from the selected ones of said wiring cells, each of said wiring cells having a specific resistivity; and connecting said plurality of resistor elements to said active cells as separate resistive circuit elements of said circuit configuration.

14. The method of claim 13 wherein the step of forming said plurality of resistor elements includes forming at least one resistor element by connecting at least two wiring cells in electrical parallel.

15. The method of claim 13 wherein the step of forming said plurality of resistor elements includes forming at least one resistor element by connecting at least two wiring cells in electrical series.

* * * * *